United States Patent [19]
Okawa

[11] Patent Number: 5,963,597
[45] Date of Patent: Oct. 5, 1999

[54] DATA TRANSMISSION APPARATUS

[75] Inventor: Hiroshi Okawa, Kanagawa, Japan

[73] Assignee: Sony Corporation, Tokyo, Japan

[21] Appl. No.: 08/826,667

[22] Filed: Apr. 7, 1997

[30] Foreign Application Priority Data

Apr. 11, 1996 [JP] Japan .................................. 8-114265

[51] Int. Cl.$^6$ .................................................. H03D 3/00
[52] U.S. Cl. ........................ 375/261; 375/340; 375/349; 375/345; 348/726; 348/735; 329/308
[58] Field of Search .................................. 375/260, 261, 375/285, 322, 324, 326, 340, 345, 349; 329/304, 306, 308; 348/6, 10–553, 725, 726, 735

[56] References Cited

U.S. PATENT DOCUMENTS

| 5,386,239 | 1/1995 | Wang et al. | 348/472 |
| 5,596,605 | 1/1997 | Kiyanagi et al. | 375/326 |
| 5,787,126 | 7/1998 | Itoh et al. | 375/340 |

FOREIGN PATENT DOCUMENTS 0 180 339  5/1986  European Pat. Off. .

OTHER PUBLICATIONS

Patent Abstracts of Japan, vol. 017, No. 570 (E–1448), Oct. 15, 1993 & JP 05 167469 A (Fujitsu Ten Ltd), Jul. 2, 1993.

*Primary Examiner*—Amanda T. Le
*Attorney, Agent, or Firm*—Frommer Lawrence & Haug, LLP.; William S. Frommer; Dennis M. Smid

[57] ABSTRACT

A data transmission apparatus applicable to transmission of data by the use of a cable of a television camera system or the like and capable of ensuring simplified exact demodulation of data transmitted through quadrature modulation. The apparatus comprises a demodulator for outputting detection signals of the quadrature-modulated signal based on reference signals whose phases are each different by a predetermined value from an I-axis reference signal and a Q-axis reference signal in the quadrature modulation; a signal level corrector for correcting the signal levels of the detection signals; and a signal converter for converting the output signals of the signal level corrector to detection signals based on the I-axis and Q-axis reference signals. An equalizer circuit is further included in the apparatus for adaptively equalizing the output signals of the signal converter or the output signals of the signal level corrector. The quadrature-modulated signal is inputted via a coaxial cable, and the above predetermined value of the phase difference is an angle of 45 degrees.

4 Claims, 7 Drawing Sheets

DATA TRANSMISSION APPARATUS

BACKGROUND OF THE INVENTION

1. Field of the Invention

The present invention relates to a data transmission apparatus and, more particularly, to transmission of data performed with the use of a cable of, for example, a television camera system or the like by generating a detection signal based on a reference signal of a phase different by a predetermined phase angle and then correcting the signal level of such detection signal to thereby ensure exact demodulation of transmitted quadrature-modulated data with facility.

2. Description of the Related Art

The video systems inclusive of television camera systems known heretofore are classified into a type for transmitting video data in a form of analog signal and a type for transmitting video data in a form of digital signal.

In transmitting video data in a form of analog signal, a coaxial cable or the like is employed as a transmission line, wherein an AGC circuit, an equalizer circuit and so forth are employed for correction of the signal level deteriorated in the transmission.

Meanwhile in transmitting video data in a form of digital signal, the video data is sampled at a predetermined sampling rate to thereby produce a digital video signal, which is then transmitted after being converted into serial data. For the purpose of effectively utilizing the existing equipment, the coaxial cable or the like used for transmission of the analog signal is also used as a transmission line, and an adaptive equalizer circuit and so forth are employed to effectively avoid any bit error that may be caused in the transmission.

It is considered that the transmission efficiency can be enhanced by applying multivalued QAM (Quadrature Amplitude Modulation) to transmission of digital video signal using such a cable. In this case, the digital video signal transmission may be performed by means of the same structure as that of a related art radio communication apparatus based on such multivalued quadrature amplitude modulation.

Figure 1:
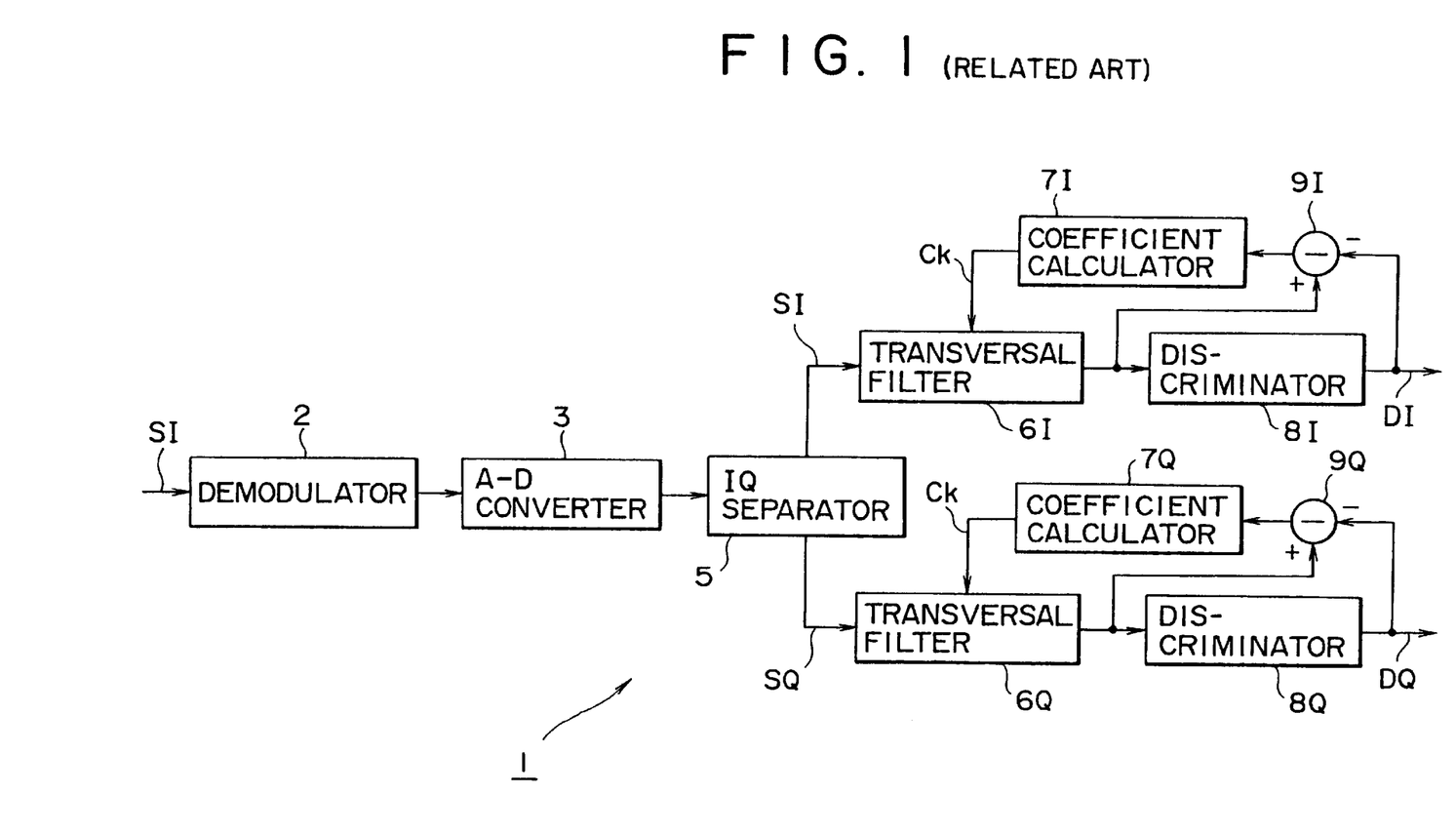
FIG. 1 is a block diagram of a demodulation circuit applied to radio communication.

FIG. 1 is a block diagram of a multivalued QAM demodulation circuit applied to a radio communication apparatus or the like. In this demodulation circuit 1, a demodulator 2 receives a multivalued quadrature amplitude modulation signal (hereinafter referred to as QAM signal) S1 and outputs synchronous detection signals based on an I-axis and a Q-axis respectively. An analog-digital converter (A/D) 3 converts such synchronous detection signals of two paths to a digital signal, and then an IQ separator 5 separates the output signal of the analog-digital converter 3 into synchronous detection results SI and SQ based on the I-axis and the Q-axis respectively.

A transversal filter 6I corrects the synchronous detection result SI by a coefficient Ck calculated in a coefficient calculator 7I and then outputs the corrected signal. A discriminator 8I converts the output signal of the transversal filter 6I to a multivalued digital signal and outputs a demodulation result DI based on the I-axis. A subtracter 9I subtracts the demodulation result DI from the output of the transversal filter 6I to thereby produce error data ERI. And a coefficient calculator 7I calculates the coefficient Ck in such a manner that the error data ERI is converged to a value 0.

Similarly, a transversal filter 6Q corrects the synchronous detection result SQ by a coefficient Ck calculated in a coefficient calculator 7Q, and a discriminator 8Q produces a demodulation result DQ based on the Q-axis from the synchronous detection result SQ. A subtracter 9Q subtracts the demodulation result DQ from the output of the transversal filter 6Q to thereby produce error data ERQ. And a coefficient calculator 7Q calculates the coefficient Ck in such a manner that the error data ERQ is converged to a value 0.

Figure 2:
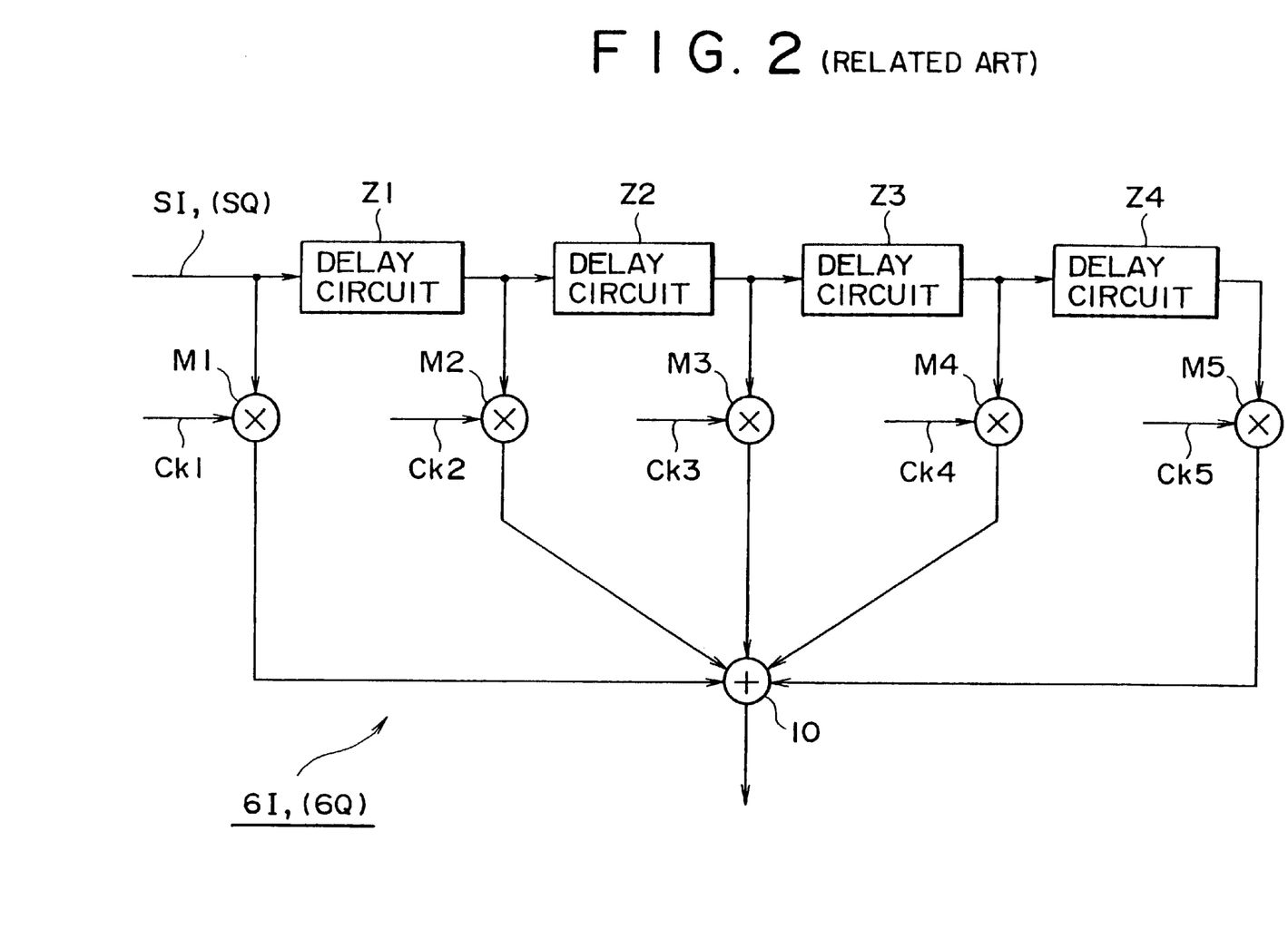
FIG. 2 is a block diagram of a transversal filter in FIG. 1.

The transversal filters 6I and 6Q for processing the synchronous detection results SI and SQ respectively in the manner described are mutually the same in circuit configuration, as shown in FIG. 2. Delay circuits Z1~Z4, where delay times are set to the repetition periods of the synchronous detection results SI and SQ, are connected in series, and the synchronous detection result SI or SQ is inputted to one end of such series circuit. The transversal filters 6I and 6Q supply the input signals of the delay circuits Z1~Z4 and the output signal of the last stage to weighting circuits M1~M5 each having a multiplier circuit configuration, wherein the signals are weighted by the coefficients Ck (Ck1~Ck5) respectively and then are added to one another in an adder 10.

Due to the above processing, the demodulation circuit 1 demodulates the QAM signal on the basis of the I-axis and the Q-axis by the technique of adaptive equalization and subsequently converts the demodulation results DQ and DI to a digital signal of one path, whereby various data transmitted wirelessly in the form of QAM signal are demodulated.

However, when a digital video signal is to be transmitted from a television camera system or the like by the application of such a demodulation circuit, there arise some difficulties in realizing exact transmission of the digital video signal.

Video signal transmission is premised on wire communication using the existing equipment inclusive of the coaxial cable and so forth. And in such wire communication, the frequency characteristic at the receiving end is widely varied in accordance with the transmission distance. Therefore, proper convergence of the coefficients is not exactly achievable by mere employment of adaptive equalization applied customarily to wire communication, and it becomes difficult to realize correct demodulation of the digital video signal.

For solving the above problems, there may be contrived a method which transmits training data instead of digital video signal during a preset period of time to thereby achieve proper convergence of the coefficient Ck with such training data. In this method, however, another problem arises with respect to deterioration of the transmission efficiency of the digital video signal. In this case also, when the frequency characteristic is widely varied due to extension of the transmission distance, proper convergence of the coefficient Ck with exact detection of the training data is supposed to be difficult. And there may occur even a worse case where the coefficient Ck is switched in a reverse direction to increase the error data to consequently cause a state of oscillation.

Further in adaptive equalization, any bit error in the demodulation result may be widely varied due to setting of the coefficient Ck to eventually bring about difficulty in properly converging the coefficient Ck because of some harmful influence of noise and so forth.

SUMMARY OF THE INVENTION

It is therefore an object of the present invention to provide a data transmission apparatus capable of realizing simplified exact demodulation of data transferred through wire transmission by the application of quadrature modulation.

For the purpose of achieving the above object, the data transmission apparatus of the present invention produces detection signals of a quadrature-modulated signal based on reference signals whose phases are each different by a predetermined angle from an I-axis reference signal and a Q-axis reference signal, and after correcting the signal levels of the detection signals, converts the same to detection signals based on the I-axis reference signal and the Q-axis reference signal.

In this apparatus, a code layout at the receiving end is changed substantially symmetrically with respect to reference axes which are each declined by a predetermined angle to the I-axis and the Q-axis. Therefore, in the detection signals of the quadrature-modulated signal based on the reference signals having a predetermined phase difference from the I-axis signal and the Q-axis signal, the substantially symmetrical change is represented with regard to the direction of each reference axis. Consequently, the whole change of the code layout can be corrected with simplicity and facility by correcting the signal levels of the detection signals. Accordingly, even when the level of the quadrature-modulated signal is widely changed in wire transmission or the like, the transmitted data can be exactly demodulated by converting the signal-level correction result to detection signals based on the I-axis reference signal and the Q-axis reference signal and then processing the converted detection signals.

The above and other features and advantages of the present invention will become apparent from the following description which will be given with reference to the illustrative accompanying drawings.

DETAILED DESCRIPTION OF THE PREFERRED EMBODIMENT

Hereinafter a preferred embodiment of the present invention will be described in detail with reference to the accompanying drawings.

Figure 3:
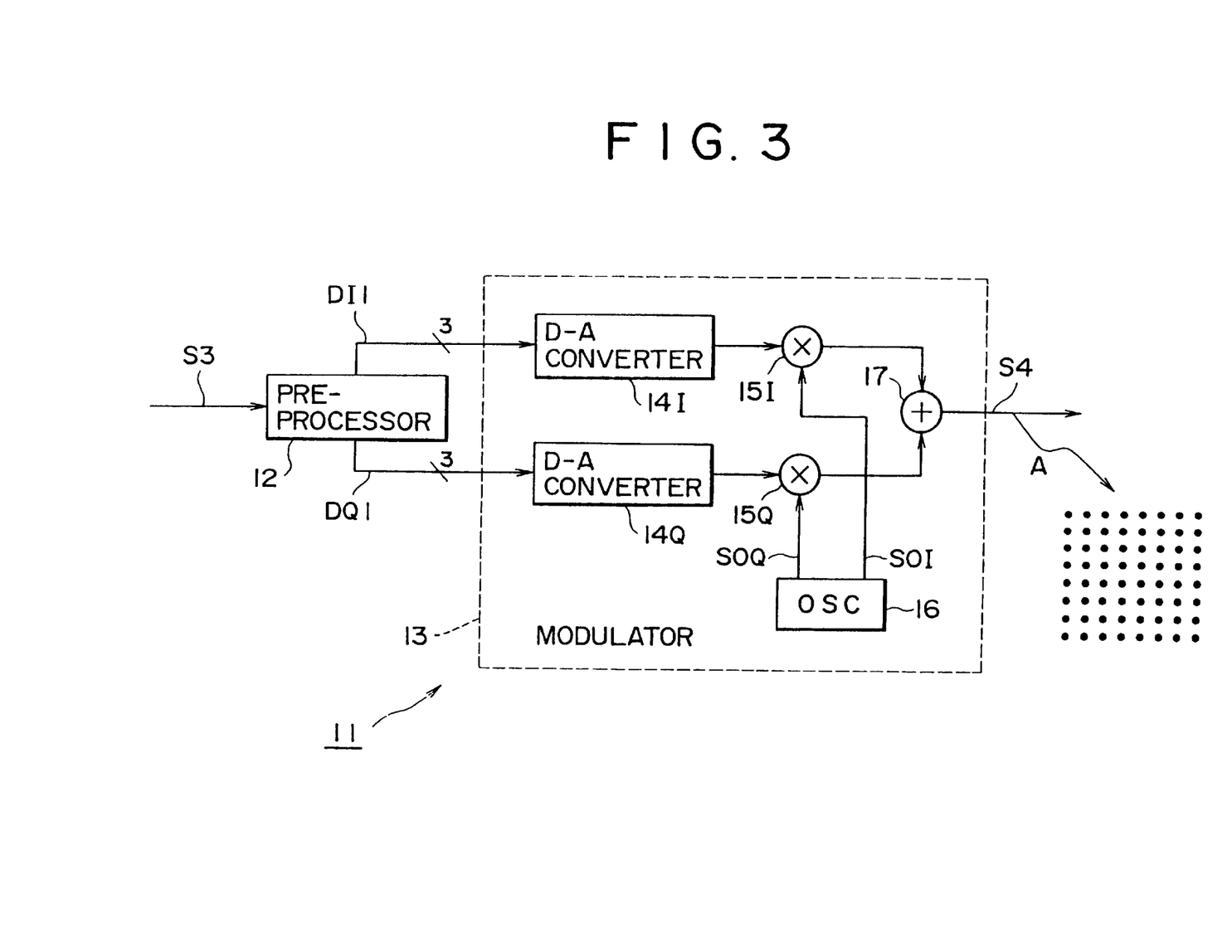
FIG. 3 is a block diagram of a sending circuit corresponding to a receiving circuit in a data transmission apparatus of the present invention.

FIG. 3 is a block diagram of a sending circuit in a data transmission apparatus shown as a preferred embodiment of the present invention. This sending circuit 11 is incorporated in a television camera for example and transmits a digital video signal, which is composed of an image pickup result, to a camera control unit through 64-valued quadrature amplitude modulation.

In this sending circuit 11, a pre-processor 12 receives the digital video signal S3 and, after adding an error correction code thereto, executes processes of scrambling and encoding the same. Thus, the pre-processor 12 converts the 10-bit data string to an I-axis modulating 3-bit data string DI1 and a Q-axis modulating 3-bit data string DQ1. In this case, the pre-processor 12 processes the digital video signal in such a manner that the code generation probabilities at the individual code layout positions are rendered mutually equal with regard to the QAM signal S4 obtained from the sending circuit 11.

A modulator 13 supplies the 3-bit data strings DI1 and DQ1 to digital-analog converters (D/A) 14I and 14Q respectively to execute digital-to-analog conversion of the data. Multipliers 15I and 15Q multiply an I-axis modulating reference signal SOI and a Q-axis modulating reference signal SQI (sine-wave signals represented by $\sin(\omega t+\pi/2)$ where $\sin(\omega t)$ denotes an I-axis modulating reference signal) outputted from an oscillator (OSC) 16, by the output signals of digital-analog converters 14I and 14Q respectively, so that these output signals are amplitude-modulated by the I-axis and Q-axis modulating reference signals respectively.

An adder 17 adds the output signals of the multipliers 15I and 15Q to each other, so that the modulator 13 outputs a 64-valued QAM signal S4 whose code layout is such as denoted by a symbol A. Subsequently the sending circuit 11 transmits the QAM signal S4 via a coaxial cable to the camera control unit.

Figure 4:
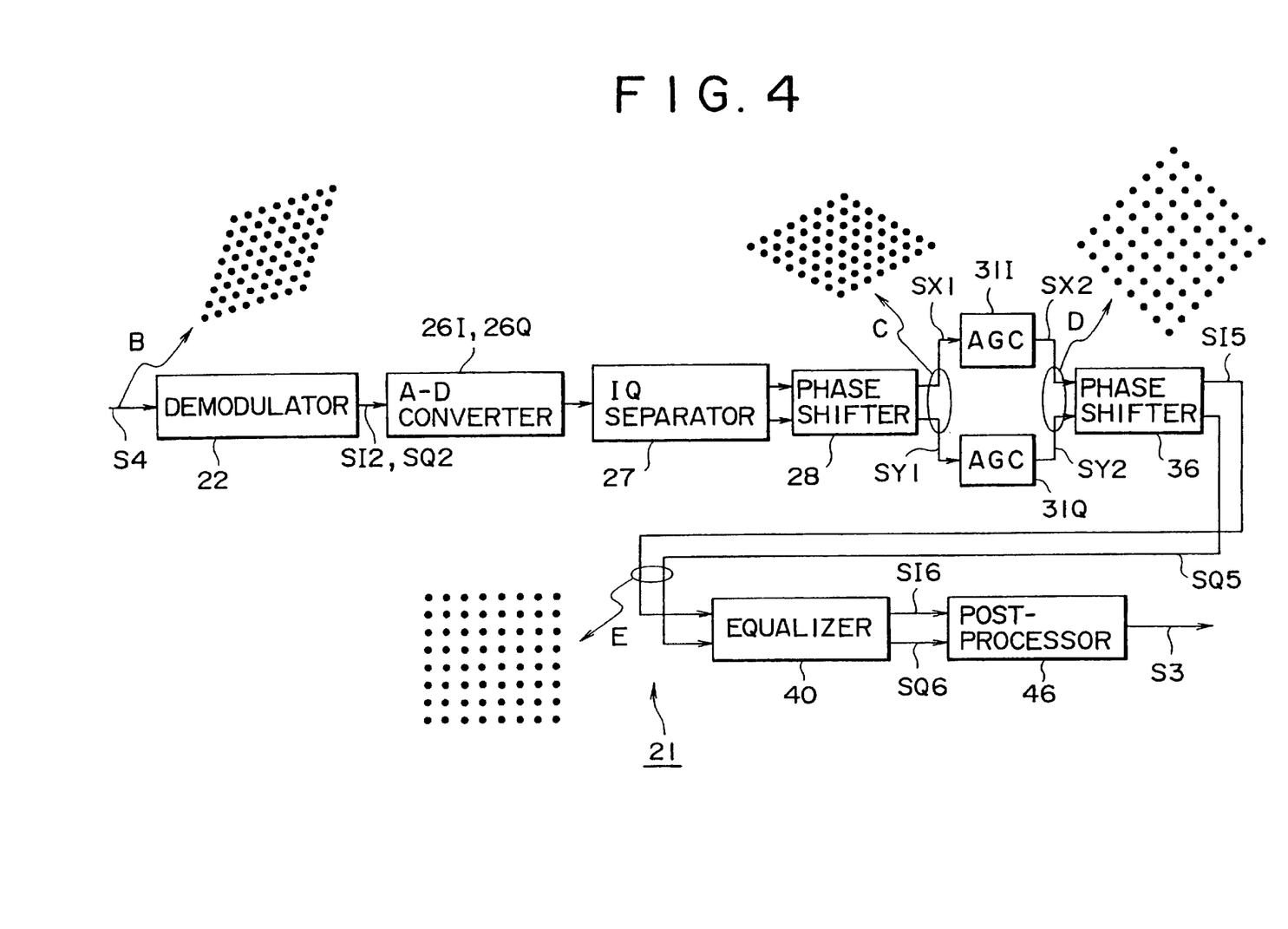
FIG. 4 is a block diagram of the receiving circuit corresponding to the sending circuit in FIG. 3.

FIG. 4 is a block diagram of a receiving circuit in the camera control unit. In this control unit, the QAM signal S4 transmitted thereto via the coaxial cable is inputted to the receiving circuit 21.

As denoted by a symbol B, the QAM signal S4 inputted to the receiving circuit 21 has a rhombic code layout deformed substantially symmetrically with respect to virtual reference axes (hereinafter referred to as deformation reference axes) which are each inclined by a predetermined angle to the I-axis and the Q-axis due to the amplitude characteristic and the phase characteristic of the coaxial cable that serves as a transmission line. And the degree of such deformation is changed widely in accordance with the characteristic of the transmission line and the transmission distance. In the case of transmission using a coaxial cable, the virtual reference axes are each inclined by an angle of 45° to the I-axis and the Q-axis respectively.

Figure 5:
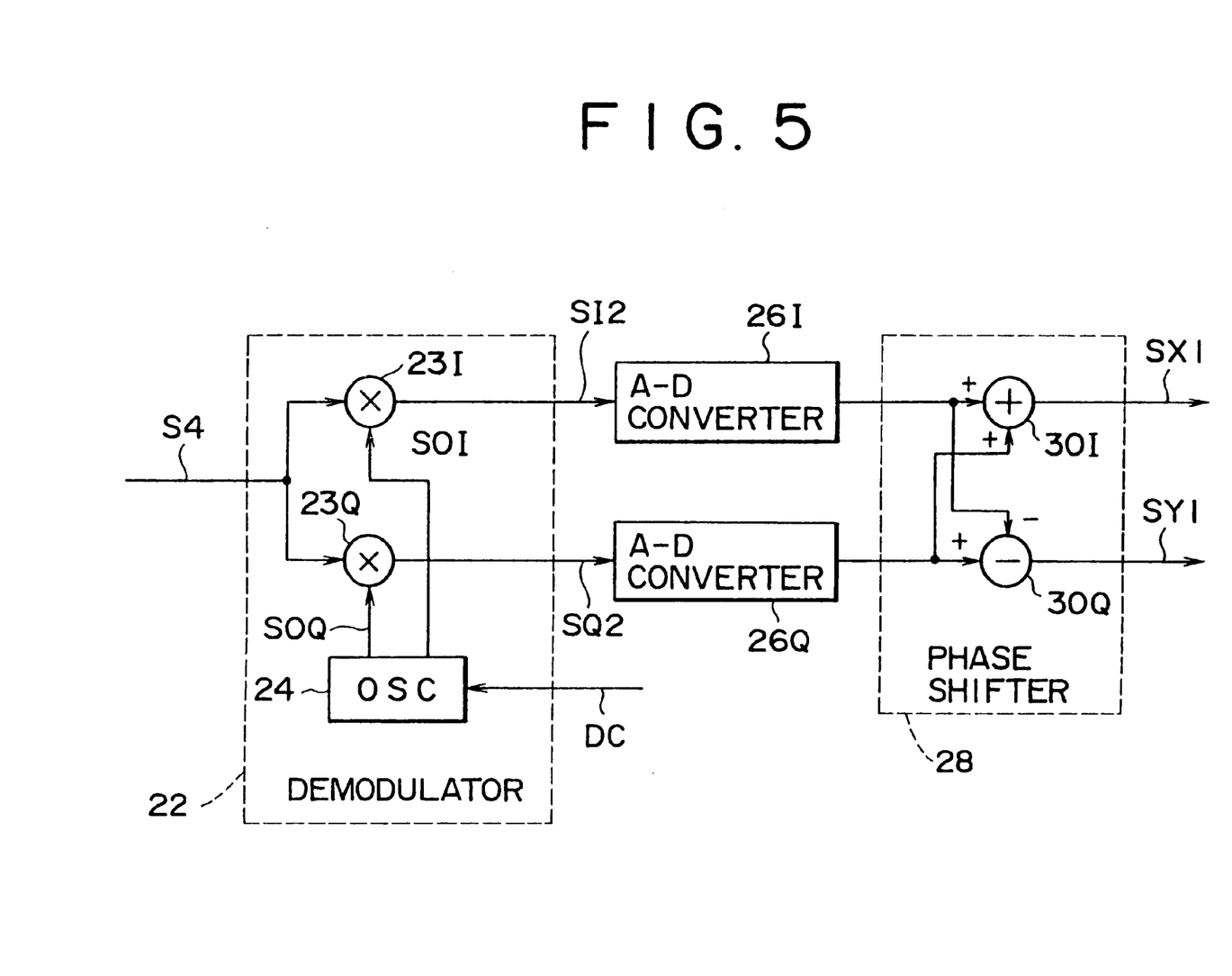
FIG. 5 is a block diagram showing details of a demodulator and so forth in FIG. 4.

In the receiving circuit 21, the QAM signal S4 is inputted to a demodulator 22. As shown in FIG. 5, multipliers 23I and 23Q multiply an I-axis demodulating reference signal SOI by the QAM signal S4 and a Q-axis demodulating reference signal SOQ by the QAM signal S4 respectively, so that the demodulator 22 produces detection signals SI2 and SQ2 through synchronous detection of the QAM signal S4 on the basis of reference signals SOI and SQI. The I-axis and Q-axis demodulating reference signals SOI and SOQ are produced in an oscillator 24. In this receiving circuit 21, the demodulation result is processed statistically to produce a control signal DC by utilizing that the digital video signal is so processed in the sending circuit 11 that the code generation probabilities at the code layout positions are rendered mutually equal. The operation of the oscillator 24 is controlled by the control signal DC in such a manner that the reference signals SOI and SOQ in the receiving circuit 21 are phase-locked respectively to the I-axis and Q-axis modulating reference signals SOI and SOQ in the sending circuit 11.

Analog-digital converters (A/D) 26I and 26Q produce playback clock signals from the detection signals SI2 and SQ2, and then execute analog-to-digital conversion of the detection signals SI2 and SQ2 sequentially at the timing based on such playback clock signals. An IQ separator 27

(FIG. 4) separates the output signals of the analog-digital converters 26I and 26Q into an I-axis component and a Q-axis component. In this embodiment, the output signals of the analog-digital converters 26I and 26Q are separated and delivered respectively to an I-axis component processing path and a Q-axis component processing path of a phase shifter 28 in the succeeding stage, whereby the IQ separator 27 is constituted.

In the phase shifter 28, the output signals of the analog-digital converters 26I and 26Q are added to each other by an adder 30I and a subtracter 30Q. Thus, the phase shifter 28 executes calculations of the following equations relative to the respective output signals SX1 and SY1 of the adder 30I and the subtracter 30Q. In these equations, $\theta$ denotes the inclination of the deformation reference axis to the I-axis and the Q-axis.

$$SX1=2^{1/2}\cdot(SI2\cdot\cos\theta+SQ2\cdot\sin\theta)=(SI2+SQ2) \quad (1)$$

$$SY1=2^{1/2}\cdot(-SI2\cdot\sin\theta+SQ2\cdot\cos\theta)=(-SI2+SQ2) \quad (2)$$

With the above calculations, the phase shifter 28 transforms the coordinate system of the detection signals SI2 and SQ2, which are based on the I-axis and the Q-axis respectively, to a coordinate system inclined by an angle of 45° to the I-axis and the Q-axis, thereby converting the detection signals SI2 and SQ2 to detection signals SX1 and SY1 based on the deformation reference axes. Consequently, the code layout of the detection signals SX1 and SY1 is deformed to be symmetrical with respect to the coordinate-transformed reference axes, as denoted by a symbol C in FIG. 4.

Figure 6:
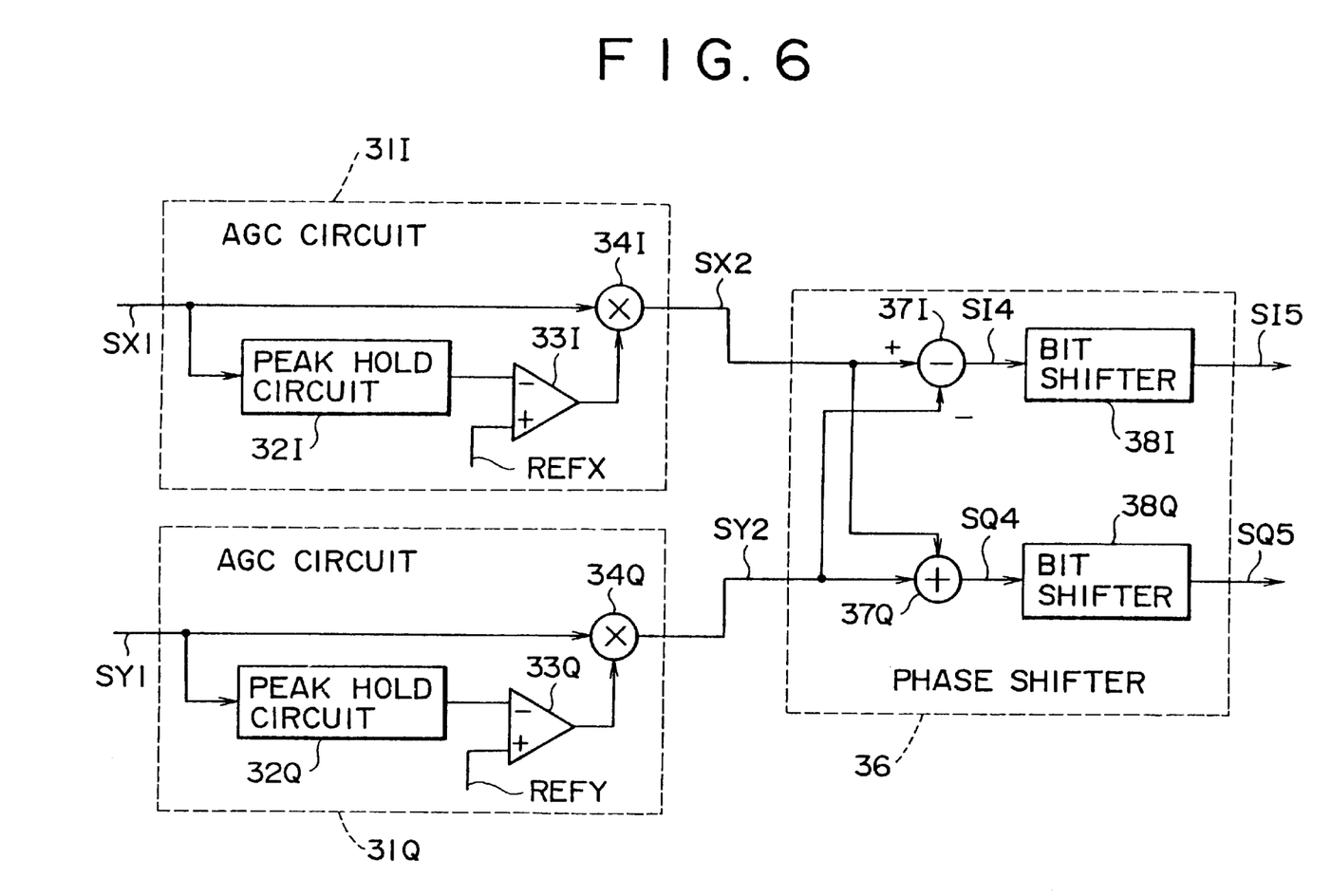
FIG. 6 is a block diagrams showing details of AGC circuits and so forth in FIG. 4.

In an AGC circuit 31I, as shown in FIG. 6, a detection signal SX1 is inputted to a peak hold circuit 32I which holds the peak value of the signal. A comparator 33I compares the peak hold result of the peak hold circuit 32I with a reference voltage REFX and then outputs a comparison result. A multiplier 34I multiplies the detection signal SX1 by the comparison result to correct the level of the detection signal SX1 to a signal level determined by the reference voltage REFX. Thus, the AGC circuit 31I corrects the level of the detection signal SX1 with reference to the peak level of the detection signal SX1 to thereby correct, relative to the code layout deformation based on the detection signals SX1 and SY1, the deformation in the X-axis direction to a certain degree determined by the reference voltage REFX.

Meanwhile in an AGC circuit 31Q, a detection signal SY1 is inputted to a peak hold circuit 32Q which holds the peak value of the signal. A comparator 33Q compares the peak hold result of the peak hold circuit 32Q with a reference voltage REFY and then outputs a comparison result. A multiplier 34Q multiplies the detection signal SY1 with the comparison result to thereby correct the level of the detection signal SY1 to a signal level determined by the reference voltage REFX. Thus, the AGC circuit 31Q corrects the level of the detection signal SY1 with reference to the peak level of the detection signal SY1 to thereby correct, relative to the code layout deformation based on the detection signals SX1 and SY1, the deformation in the Y-axis direction to a certain degree determined by the reference voltage REFY.

Thus, as denoted by a symbol D in FIG. 4, the AGC circuits 31I and 31Q correct the code layouts based on the detection signals SX1 and SY1 in a manner to correspond to the nondeformed code layout immediately after output from the sending circuit 11.

The phase shifter 36 transforms the respective output signals SX2 and SY2 of the AGC circuits 31I and 31Q to I-axis and Q-axis coordinates, thereby transforming the output signals SX2 and SY2, which are obtained by correcting the code layout deformation, to the former coordinate system. More specifically, in the phase shifter 36, a subtracter 37I subtracts the output signals SX2 and SY2 of the AGC circuits 31I and 31Q, while an adder 37Q adds such output signals SX2 and SY2, thereby executing coordinate transformation respectively as expressed by the following equations.

$$SI4=2^{1/2}\cdot(SX2\cdot\cos\theta-SY2\cdot\sin\theta)=(SX2-SY2) \quad (3)$$

$$SQ4=2^{1/2}\cdot(SX2\cdot\sin\theta+SY2\cdot\cos\theta)=(SX2+SY2) \quad (4)$$

Bit shifters 38I and 38Q shift the output signal SI4 of the subtracter 37I and the output signal SQ4 of the adder 37Q by one bit respectively, thereby lowering to a half the signal level of each of the output signals SI4 and SQ4 changed through the coordinate transformation executed twice, to consequently correct the signal levels to those corresponding to the former detection signals SI2 and SQ2.

Figure 7:
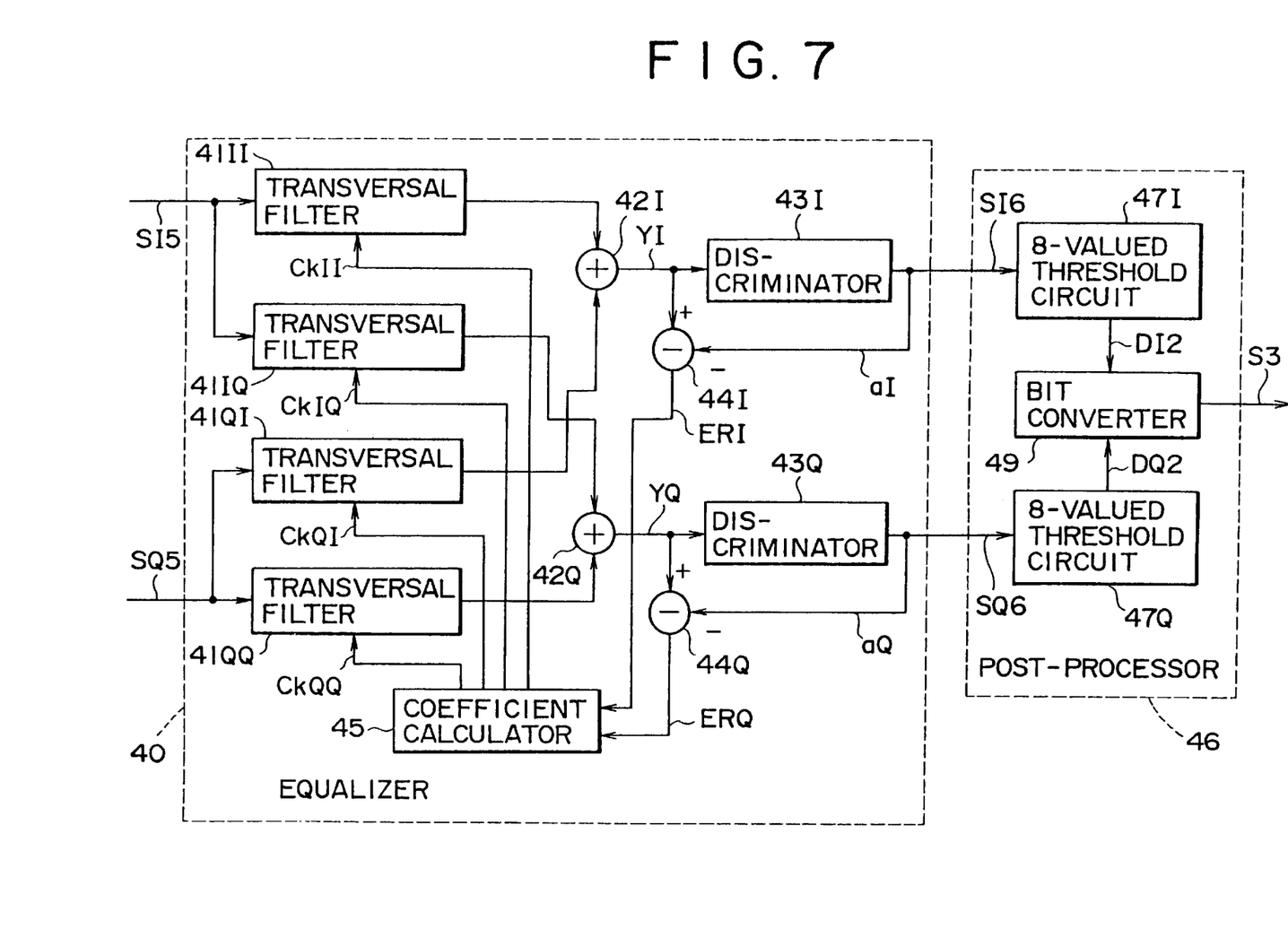
FIG. 7 is a block diagram showing details of an equalizer and so forth in FIG. 4.

An equalizer 40 adaptively equalizes the output signals SI5 and SQ5 of the bit shifters 38I and 38Q so as to enhance demodulation of the QAM signal S4 further exactly. More specifically, as shown in FIG. 7, the equalizer 40 includes transversal filters 41II, 41IQ, 41QI and 41QQ of four paths each having the same structure as that described in connection with FIG. 2, and supplies an output signal S15 to the transversal filters 41II and 41IQ while supplying an output signal SQ5 to the transversal filters 41QI and 41QQ.

An adder 42I receives output signals from the transversal filters 41II and 41QI to which the signals S15 and SQ5 are allocated respectively, and then adds the received signals to each other to thereby eliminate, in its output, the influence of the Q-axis based detection result SQ5 from the I-axis based detection result SI5. A discriminator 43I discriminates the output signal YI of the adder 42I and corrects the signal level thereof to the value presumed to be the original one. A subtracter 44I subtracts the output signal ak of the discriminator 43I from the output signal YI of the adder 42I to thereby produce an error data ERI as its output.

Similarly to the above, an adder 42Q receives output signals from the transversal filters 41IQ and 41QQ to which the signals SI5 and SQ5 are allocated respectively, and then adds the received signals to each other to thereby eliminate, in its output, the influence of the I-axis based detection result SI5 from the Q-axis based detection result SQ5. A discriminator 43Q discriminates the output signal YQ of the adder 42Q and corrects the signal level thereof to the value presumed to be the original one. A subtracter 44Q subtracts the output signal ak of the discriminator 43Q from the output signal YQ of the adder 42Q to thereby produce an error data ERQ as its output.

A coefficient calculator 45 calculates coefficients CkII and CkQI of the transversal filters 41II and 41IQ on the basis of the error data ERI, and also calculates coefficients CkQI and CkQQ of the transversal filters 41QI and 41QQ on the basis of the error data ERQ. The calculations of such coefficients are executed according to the following general equation.

$$CK_{i+1} = CK_i - \alpha \cdot \sum_{k=j}^{N} X_{k-j} \cdot ER \quad (5)$$

-continued $$\partial D / \partial Ck = 2 \sum_{k=j}^{N} (Yk - ak) \partial Yk / \partial Ck$$

$$= 2 \sum_{k=j}^{N} X_{k-j} \cdot ER$$

In the above, D denotes an evaluation function. Thus, the equalizer 40 executes a process of adaptive equalization after correcting the code layout deformation, hence ensuring exact adaptive equalization despite any wide change of the coaxial cable length and so forth.

A post-processor 46 receives the output signals SI6 and SQ6 of the equalizer 40 by eight-valued threshold circuits 47I and 47Q respectively, where the received signals are converted to three-bit digital signals on the basis of an eight-valued threshold respectively. A bit converter 49 receives the digital signals DI2 and DQ2 from the eight-valued threshold circuits 47I and 47Q, and then converts the same to the former ten-bit digital video signal S3.

In the circuit configuration mentioned, the digital video signal S3 (FIG. 3) is processed through predetermined operations in the pre-processor 12 to be thereby converted to I-axis and Q-axis modulating three-bit data strings DI1 and DQ1 in such a manner that the code generation probabilities at the code layout positions are rendered mutually equal. The data strings DI1 and DQ1 are supplied to the digital-analog converters (D/A) 14I and 14Q where digital-to-analog conversion is executed. The analog signals obtained as a result of such conversion are amplitude-modulated with the I-axis and Q-axis modulating reference signals SOI and SQI respectively, and then are added to each other in the succeeding adder 17. A 64-valued QAM signal S4 for transmission of the digital video signal S3 is thus produced, and then the QAM signal S4 is transmitted via a coaxial cable to the camera control unit.

In this camera control unit, the QAM signal S4 (FIG. 4) has a rhombic code layout deformed substantially symmetrically with respect to the deformation reference axes which are each inclined by a predetermined angle to the I-axis and the Q-axis due to the characteristic of the coaxial cable. And in the case of transmission using a coaxial cable, the virtual reference axes are each inclined by an angle of 45° to the I-axis and the Q-axis respectively.

In the demodulator 22 (FIG. 5), the QAM signal S4 is synchronously detected on the basis of the I-axis and Q-axis demodulating reference signals SOI and SOQ, and then the detection signals SI2 and SQ2 thereof are converted sequentially to digital signals in the analog-digital converters 26I and 26Q. Further in the succeeding phase shifter 28, such digital signals are converted to detection signals SI2 and SQ2 whose coordinate axes are deformation reference axes obtained through the simple processing of addition and subtraction executed according to Eqs. (1) and (2). Consequently, as denoted by a symbol C in FIG. 4, the code layout of the QAM signal S4 based on the detection signals SX1 and SY1 is deformed symmetrically with respect to the deformation reference axes after such coordinate transformation.

The peak levels of the detection signals SX1 and SY1 (FIG. 6) in the directions of the deformation reference axes are detected in the AGC circuits 31I and 31Q respectively, and the whole signal level is corrected in the multipliers 41I and 31Q in such a manner that the detected peak levels become predetermined signal levels prescribed by the reference voltages REFX and REFY. Consequently, as denoted by a symbol D in FIG. 4, the code layout deformation is so corrected as to correspond to the non-deformed code layout immediately after output from the transmitting circuit 11.

The detection signals SX2 and SY2 thus corrected with regard to the code layout deformation are converted, in the succeeding phase shifter 36, to detection signals SI4 and SQ4 of the former coordinate system through the simple processing of addition and subtraction executed according to Eqs. (3) and (4), and the signal levels thereof are corrected by the bit shifters 38I and 38Q.

Further in the succeeding equalizer 40 (FIG. 7), the detection signals SI5 and SQ5 are processed through adaptive equalization. After being equalized in the transversal filters 41II to 41QQ of four paths, the I-axis equalized output and the Q-axis equalized output are added in the adders 42I and 42Q respectively, and then error data ERI and ERQ are produced. Subsequently coefficients CkII–CkQQ are produced out of the error data ERI and ERQ, so that the detection signals SI5 and SQ5 are rendered free from mutual influence through adaptive equalization. In this operation, the code layout deformation is previously corrected to avoid any undesired phenomenon such as oscillation effectively, hence achieving proper equalization.

In this manner, the output signals SI6 and SQ6 of the equalizer 40 are demodulated to the original digital video signal S3 in the succeeding post-processor 46 with effective avoidance of any bit error.

In the circuit configuration mentioned, the detection signals SI2 and SQ2 based on the I-axis and Q-axis are converted to detection signals SX1 and SY1 based on the deformation reference axes and, after correction of the signal levels thereof, the coordinate system is returned to the former one. Therefore, the code layout deformation can be corrected by a simple process of addition and subtraction and a process of correction of the signal levels. Consequently, it becomes possible to transmit the digital video signal in the form of a 64-valued QAM signal via a coaxial cable and to demodulate the same to recover the original digital video signal with simplicity, facility and certainty.

The above embodiment represents an exemplary case of generating detection signals SX1 and SY1 based on deformation reference axes by executing addition and subtraction of the detection signals SI2 and SQ2 based respectively on the I-axis and the Q-axis. However, the present invention is not limited merely to such embodiment alone, and the detection signals SX1 and SY1 based on the deformation reference axes may be generated by first producing reference signals whose phases are each different by a predetermined value from the I-axis reference signal and the Q-axis reference signal, and then synchronously detecting the QAM signal directly on the basis of such reference signals. In the latter case, the entire structure can further be simplified.

Also the above embodiment represents an exemplary case of generating reference signals SOI and SOQ for detection by statistically processing the demodulation result. However, the present invention is not limited thereto alone, and the reference signals SOI and SOQ for detection may be generated on the basis of pilot signals transmitted separately.

The above embodiment represents an exemplary case of processing the detection signals SI2 and SQ2 after converting the same to digital signals. However, the present invention is not limited thereto alone, and the entire structure may be composed of analog signal processing circuits, or the conversion into digital signals may be executed immediately before adaptive equalization for example.

The above embodiment represents an exemplary case of correcting the signal levels of detection signals SX1 and SY1 in accordance with the peak hold result. However, the present invention is not limited thereto alone, and the signal levels of the detection signals SX1 and SY1 may be corrected on the basis of the average levels of the detection signals SX1 and SY1.

Further the above embodiment represents an exemplary case where the coordinate system of the detection signals SI2 and SQ2 is transformed, in accordance with the inclination of the deformation reference axes to the I-axis and Q-axis, into a coordinate system inclined by an angle of 45° to the I-axis and the Q-axis. However, the present invention is not limited merely to such example of transformation into a coordinate system with a 45° inclination. The point is that, when the inclination is different depending on the characteristic of the transmission line, an adequate coordinate system may be set correspondingly to such inclination to thereby achieve proper demodulation of the QAM signal transmitted via any of various transmission lines.

The above embodiment represents an exemplary case where adaptive equalization is performed in combination. However, the present invention is not limited thereto alone, and the process of adaptive equalization may be omitted in accordance with requirements. And the circuit configuration may be so modified that, instead of such process, the digital signals are equalized immediately after being outputted from the AGC circuits.

The above embodiment represents an exemplary case of transmitting a digital video signal in the form of 64-valued QAM signal. However, the present invention is not limited thereto alone, and it is widely applicable to transmission of various data by the use of multivalued QAM signal, or to transmission of various data through quadrature modulation.

Further the above embodiment represents an exemplary case of employing a coaxial cable as a transmission line. However, the present invention is not limited thereto alone, and it is widely applicable to transmission of quadrature-modulated signal via any of various cables, or to transmission through radio communication.

Thus, the data transmitted by the application of quadrature modulation can be demodulated with simplicity and certainty by first producing detection signals based on reference signals whose phases are each different by a predetermined phase angle, then correcting the signal levels of such detection signals, and transforming the coordinate system thereof into the original one.

Although the present invention has been described hereinabove with reference to some preferred embodiments thereof, it is to be understood that the invention is not limited merely to such embodiments, and a variety of other changes and modifications will be apparent to those skilled in the art without departing from the spirit of the invention.

The scope of the invention, therefore, is to be determined solely by the appended claims.

What is claimed is:

1. A data transmission apparatus for demodulating data from a quadrature-modulated signal, comprising:

demodulation means for outputting detection signals of said quadrature-modulated signal based on reference signals whose phases are each different by a predetermined value from an I-axis reference signal and a Q-axis reference signal in said quadrature modulation;

signal level correction means for correcting the signal levels of said detection signals; and signal conversion means for converting the output signals of said signal level correction means to detection signals based on said I-axis reference signal and Q-axis reference signal.

2. A data transmission apparatus for demodulating data from a quadrature-modulated signal, comprising:

demodulation means for outputting detection signals of said quadrature-modulated signal based on reference signals whose phases are each different by a predetermined value from an I-axis reference signal and a Q-axis reference signal in said quadrature modulation;

signal level correction means for correcting the signal levels of said detection signals; and first signal conversion means for converting the output signals of said signal level correction means to detection signals based on said I-axis reference signal and Q-axis reference signal;

wherein said demodulation means has detection means for outputting the detection signals of said quadrature-modulated signal based on said I-axis reference signal and Q-axis reference signal; and second signal conversion means for converting the detection result of said detection means to detection signals based on said reference signals of the difference phases.

3. A data transmission apparatus for demodulating data from a quadrature-modulated signal, comprising:

demodulation means for outputting detection signals of said quadrature-modulated signal based on reference signals whose phases are each different by a predetermined value from an I-axis reference signal and a Q-axis reference signal in said quadrature modulation;

signal level correction means for correcting the signal levels of said detection signals; and first signal conversion means for converting the output signals of said signal level correction means to detection signals based on said I-axis reference signal and Q-axis reference signal;

an equalizer circuit for adaptively equalizing the output signals of said first signal conversion means, or the output signals of said signal level correction means.

4. The data transmission apparatus according to claim 1, wherein said quadrature-modulated signal is inputted via a coaxial cable, and said predetermined value of the phase difference is an angle of 45 degrees.

* * * * *